(12) United States Patent
Ogura et al.

(10) Patent No.: US 9,057,968 B2
(45) Date of Patent: Jun. 16, 2015

(54) POSITIONING APPARATUS, EXPOSURE APPARATUS AND METHOD OF MANUFACTURING DEVICE

(75) Inventors: Masahiro Ogura, Tokyo (JP); Noriyasu Hasegawa, Utsunomiya (JP); Yasuyuki Tamura, Yokohama (JP)

(73) Assignee: CANON KABUSHIKI KAISHA (JP)

( * ) Notice: Subject to any disclaimer, the term of this patent is extended or adjusted under 35 U.S.C. 154(b) by 407 days.

(21) Appl. No.: 13/551,696

(22) Filed: Jul. 18, 2012

(65) Prior Publication Data

US 2013/0045448 A1 Feb. 21, 2013

(30) Foreign Application Priority Data

Aug. 15, 2011 (JP) ................. 2011-177741

(51) Int. Cl.
*G03B 27/58* (2006.01)
*G03B 27/42* (2006.01)
*G03F 7/20* (2006.01)

(52) U.S. Cl.
CPC ........ *G03F 7/70758* (2013.01); *G03F 7/70858* (2013.01)

(58) Field of Classification Search
CPC ............ G03F 7/70758; G03F 7/70933; G03F 7/70775

USPC .......................... 355/30, 53, 72–76
See application file for complete search history.

(56) References Cited

U.S. PATENT DOCUMENTS 7,298,457 B2 * 11/2007 Maruyama ...................... 355/72
7,460,213 B2 12/2008 Maruyama

FOREIGN PATENT DOCUMENTS

JP 2006216866 A 8/2006

* cited by examiner

*Primary Examiner* — Hung Henry Nguyen
(74) *Attorney, Agent, or Firm* — Rossi, Kimms & McDowell LLP

(57) ABSTRACT

A positioning apparatus for a moving object includes: a driving unit including a stator and a movable element connected to the moving object via a connecting member; a chassis which includes an opening which allows movement of the connecting member upon driving of the movable element, and an exhaust outlet which includes end exhaust outlets arranged at first and second ends of the driving range of the movable element; an exhaust unit which exhausts a gas in the chassis; and a controller which controls the exhaust unit so that an amount of exhaust from the end exhaust outlet arranged at the first end becomes larger when the movable element is driven toward the first end on a side of the first end of the driving range than when the movable element is positioned at the center of the driving range.

13 Claims, 6 Drawing Sheets

POSITIONING APPARATUS, EXPOSURE APPARATUS AND METHOD OF MANUFACTURING DEVICE

BACKGROUND OF THE INVENTION

1. Field of the Invention

The present invention relates to a positioning apparatus, an exposure apparatus, and a method of manufacturing a device.

2. Description of the Related Art

In general, an exposure apparatus includes a driving unit including a movable element and stator, a laser interferometer for measuring the position of a stage which moves by the driving unit, a supply unit which supplies a temperature-regulated gas to the light path of measurement light from the laser interferometer, and a recovery unit which recovers the gas. An exposure apparatus required to achieve a positioning accuracy on the level of several nanometers must control the environmental conditions in the exposure apparatus, such as the temperature, humidity, and pressure, constant. Hence, a change in environment is suppressed by supplying a gas having, for example, an accurately controlled temperature from the gas supply unit into the entire apparatus in one direction.

The exposure apparatus often uses a linear motor which can be driven in a non-contact manner as a driving device for a substrate stage which holds a substrate. The linear motor generally uses coils which generate a very large amount of heat upon energization and are therefore one of main heat sources in the exposure apparatus. Hence, the amount of heat generated by the linear motor must be kept small when the exposure apparatus is used in an environment having a temperature controlled constant. For this reason, a technique of containing coils in a jacket, and supplying a coolant to the coils, thereby recovering heat generated by the coils is widely employed. However, it is difficult to sufficiently recover the heat generated by the coils and maintain the surface temperature of the linear motor uniform. Japanese Patent Laid-Open No. 2006-216866 discloses a technique of surrounding a driving unit using a chassis so as to separate it from a stage space, and evacuating the chassis through exhaust ducts, thereby preventing an atmosphere heated by heat which cannot be removed by a coolant from leaking to the stage space.

In the related art technique disclosed in Japanese Patent Laid-Open No. 2006-216866, a movable element and a stage are connected to each other via a connecting member, and an opening is formed in the chassis along the moving range of the connecting member. Hence, as the connecting member moves in the opening at high speed, the gas around the opening is disturbed, is heated by heat generated by the driving unit, and then leaks to the stage space. Further, as the movable element moves to the end of the chassis at high speed, the gas between the chassis and the movable element is compressed, heated, and then pushed out from the end of the opening. In the exposure apparatus, the speed and acceleration of the stage are increasing in order to improve the throughput, so a heated gas is more likely to leak to the stage space.

To prevent the leakage of a heated gas to the stage space, it is possible to increase the amount of exhaust from the chassis which surrounds the driving unit. However, as the amount of exhaust increases, the flow of the gas supplied by the supply unit to condition the air in the stage space is disturbed more, so the air in the light path of the interferometer may fluctuate. Furthermore, due to the increase in amount of exhaust, the size of the air-conditioning equipment of the exposure apparatus may increase, leading to a rise in apparatus cost. In this manner, unless it is possible to sufficiently ensure the reliability of exhaust from the driving unit corresponding to a speedup of the stage, a heated gas leaks from the chassis which surrounds the driving unit to the stage space. That heated gas flows to the vicinity of the stage along the flow of the gas supplied from the gas supply unit. Furthermore, upon driving of the stage, the stagnant gas rolls up and spreads to the entire apparatus, thus influencing the laser interferometer.

SUMMARY OF THE INVENTION

The present invention provides a positioning apparatus for a moving object, which suppresses leakage of a gas heated by a driving unit for the moving object.

The present invention in its one aspect provides a positioning apparatus for a moving object, the apparatus comprising: a driving unit including a stator and a movable element connected to the moving object via a connecting member; a chassis which contains the movable element and the stator in a driving range of the movable element, and includes an opening which allows movement of the connecting member upon driving of the movable element, and an exhaust outlet which includes end exhaust outlets arranged at a first end and a second end, respectively, of the driving range; an exhaust unit which exhausts a gas in the chassis from the exhaust outlet; and a controller which controls the exhaust unit so that an amount of exhaust from the end exhaust outlet arranged at the first end becomes larger when the movable element is driven toward the first end on a side of the first end of the driving range than when the movable element is positioned at the center of the driving range.

Further features of the present invention will become apparent from the following description of exemplary embodiments with reference to the attached drawings.

DESCRIPTION OF THE EMBODIMENTS

Figure 1:
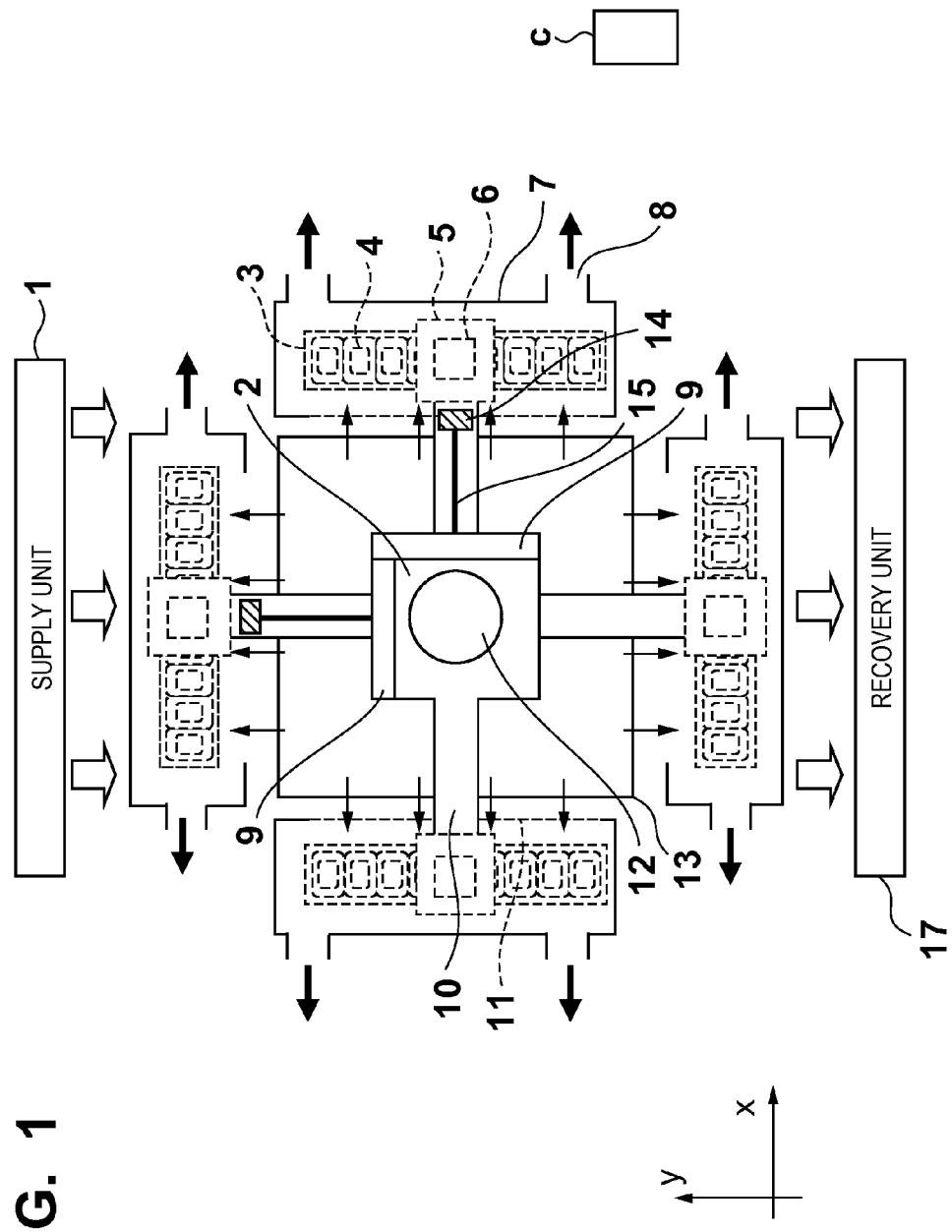
FIG. 1 is a top view of an exposure apparatus.

Embodiments of the present invention will be described in detail below with reference to the accompanying drawings. Note that modes to be described in the following embodiments provide merely examples and can be appropriately modified or changed in accordance with the apparatus configuration and various conditions. FIG. 1 is a schematic top view showing the configuration of a positioning apparatus which includes a linear motor and can be used for a substrate stage of an exposure apparatus.

The positioning apparatus includes a stage base 13 and stage 2. A linear motor (driving unit) which drives the stage (moving object) 2 includes a stator 3 having coils 4, and a movable element 5 having a magnet 6. Upon supply of a current to the coils 4 in an appropriate phase, a Lorentz force acts on the magnet 6 to produce a thrust in the movable element 5. A substrate 12 on which a pattern is to be transferred or drawn is held on a chuck (not shown) placed on the stage 2. The stage 2 is connected via connecting members 10 to linear motors, as mentioned above, which are arranged in four directions around it, and can move upon driving of these linear motors.

At least one coolant channel (not shown) is formed in the stator 3, and Joule heat generated by the coils 4 as heating elements is recovered by a coolant. Also, a chassis 7 which contains the movable element 5 and stator 3 is arranged outside the stator 3 in the driving range of the movable element 5 to prevent heat which cannot be recovered by the coolant from influencing the ambient environment. Moreover, the chassis 7 includes exhaust outlets 8 to be connected to exhaust ducts, and forcibly exhausts the gas heated by the coils 4 in itself to the exterior of the apparatus. The chassis 7 includes a temperature regulation channel (not shown) formed in its surface, and can supply and temperature-regulate a coolant. When the stator 3 is arranged in a U-shape so as to sandwich the movable element 5 from the two sides, the stator 3 may serve as the chassis 7.

The movable element 5 and stage 2 are connected to each other via the connecting member 10, thereby transmitting the driving force of the movable element 5 to the stage 2. The chassis 7 includes an opening 11 which allows movement of the connecting member 10 within a moving range L of the connecting member 10, and also serves to trap the air in a stage space into itself to directly cool the linear motor while it is prevented from hindering movement of the stage 2 by the opening 11. A stage apparatus includes an interferometer 14 which emits a laser beam 15 to measure the position of the stage 2, and a reflecting mirror 9 which is placed on the stage 2 and reflects the laser beam 15 toward the interferometer 14. The interferometer 14 projects the laser beam 15 onto the reflecting mirror 9, and receives the laser beam 15 reflected by the reflecting mirror 9, thereby measuring the position of the stage 2.

A temperature-regulated gas is blown from a supply unit 1 into the stage space. The supply unit 1 adopts a side flow type which almost horizontally supplies a gas onto the stage base 13, and supplies a temperature-regulated gas in the −y direction. A recovery unit 17 is placed at a position opposed to the supply unit 1, and recovers the gas from the supply unit 1. An air-conditioning apparatus including these units forms a gas flow uniform in the −y direction within the stage space to maintain the temperature, pressure, and humidity in the stage space constant, thereby reducing a fluctuation of the interferometer 14.

As a measure against the heat generated by the linear motor, the driving unit is surrounded by the chassis 7, and heat is forcibly exhausted from the interior of the chassis 7, as described earlier. However, even if this measure is taken, the air heated by heat generated in the chassis 7 may leak from the opening 11 to the stage space. This is because when the driving direction of the movable element 5 is reversed at the end of the chassis 7, the gas trapped by this end and the movable element 5 is compressed and pushed out to the stage space upon passing through the opening 11. For this reason, end exhaust outlets 8 are arranged in the chassis 7 surrounding the driving unit at the two ends (first and second ends) of the driving range of the movable element 5, thereby suppressing heat leakage from the end of the opening 11 in the chassis 7.

[First Embodiment]

Figure 2A:
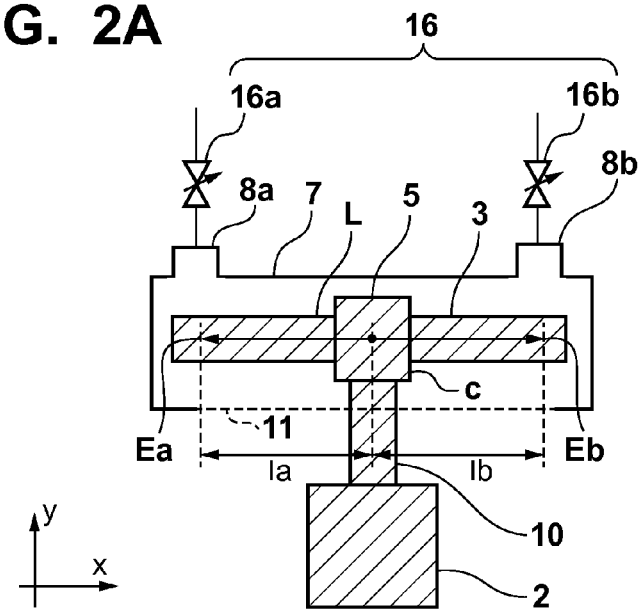
FIGS. 2A and 2B are views showing flow control of end exhaust outlets according to the first embodiment.

FIG. 2A shows one driving unit of a stage 2 according to the first embodiment. End exhaust outlets 8a and 8b which exhaust the gas in a chassis 7 are formed in the chassis 7 at positions corresponding to a first end Ea and a second end Eb, respectively, in a driving range L of a movable element 5. Flow control valves 16a and 16b are connected to the end exhaust outlets 8a and 8b, respectively, and can control the amounts of exhaust from the end exhaust outlets 8a and 8b. A controller C causes the flow control valves 16a and 16b to control the amounts of exhaust from the end exhaust outlets 8a and 8b, respectively, in accordance with the position and driving direction of the movable element 5, thereby suppressing leakage of heated air from the chassis 7 with less exhaust at a lower flow rate. The controller C may continuously control the amounts of exhaust from the end exhaust outlets 8a and 8b in accordance with the position of the stage 2, or may control them stepwise within the driving range L. This exhaust amount control is always done during driving of the movable element 5 so as to optimize the amounts of exhaust.

Figure 2B:
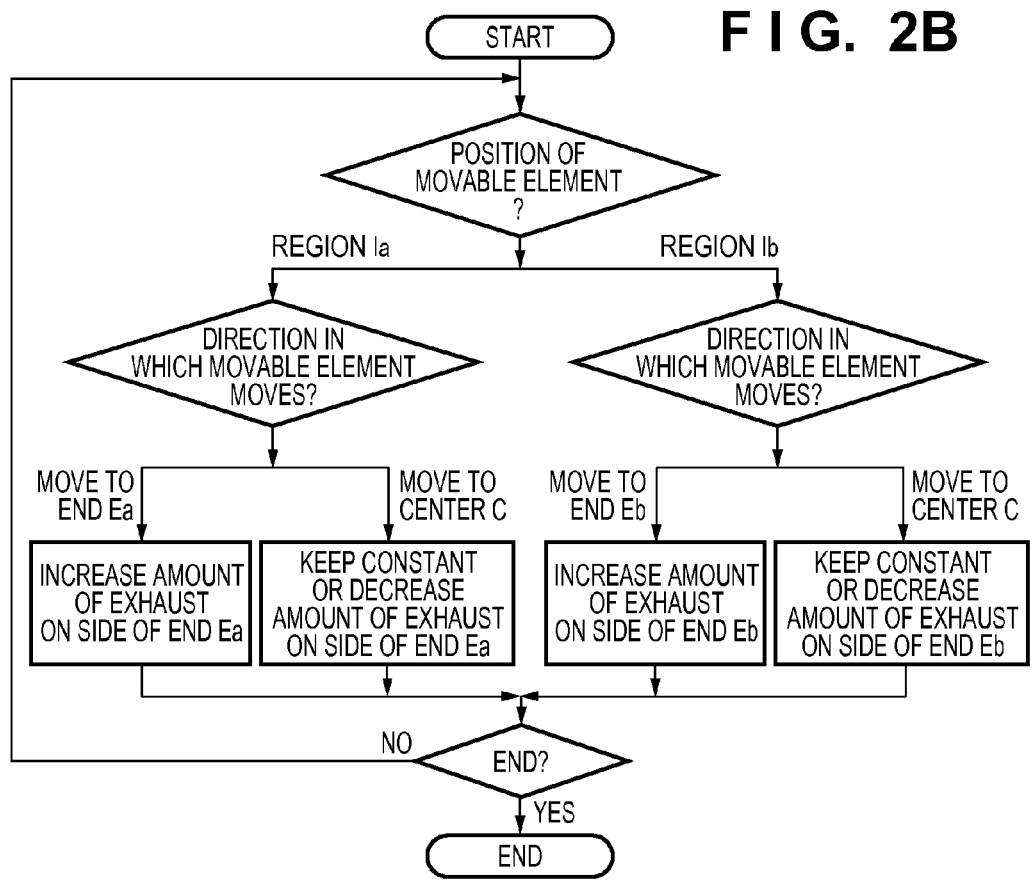

FIG. 2B is a flowchart illustrating an example of control of the amounts of exhaust from the end exhaust outlets 8a and 8b by the flow control valves 16 of the controller C. First, the controller C determines whether the movable element 5 is present in a region la on the side of the end Ea (first end side) or a region lb on the side of the end Eb (second end side) within the driving range L, based on the position information of the stage 2 obtained by an interferometer 14. The controller C determines the driving direction of the movable element 5. When the movable element 5 is driven toward the end of the driving range L, the amount of exhaust from the exhaust outlet at this end is set larger than when the movable element 5 is positioned at the center of the driving range. In contrast, when the movable element 5 is driven from the end to the center of the driving range L or the movable element 5 itself stands still, the amount of exhaust from the exhaust outlet at this end is set smaller than when the movable element 5 is driven toward the end of the driving range L. In reciprocally driving the movable element 5 within the driving range L, the amount of exhaust from the exhaust outlet at each end is repeatedly increased/decreased to efficiently reduce a gas pushed out from an opening 11 in the chassis 7. In the first embodiment, pipes connected to the exhaust outlets, the flow control valves 16a and 16b, and the exhaust ducts (not shown) constitute an exhaust unit which exhausts the gas in the chassis 7 from the exhaust outlets.

[Second Embodiment]

Control of the amount of exhaust from a chassis 7 according to the second embodiment will be described with reference to FIGS. 3A, 3B, and 4A to 4C. Note that the same reference numerals as in the above-mentioned first embodiment denote the same constituent elements throughout these drawings, and a description thereof will not be given. The distance between a movable element 5 and one end of the chassis 7 is defined as a, an exhaust outlet closer to one end of the chassis 7 is defined as an end exhaust outlet 8a, the distance between the movable element 5 and the other end of the chassis 7 is defined as b, and an exhaust outlet closer to the other end of the chassis 7 is defined as an end exhaust outlet 8b. A controller C calculates the distances a and b based on the position information of a stage 2 to control the ratio between the amounts of exhaust from the end exhaust outlets 8a and 8b, respectively, in accordance with the ratio between the distances a and b. The controller C controls so that the amount of exhaust from the end exhaust outlet closer to the movable element 5 becomes larger than that of exhaust from the end exhaust outlet farther from the movable element 5, thereby suppressing leakage of a heated gas from the end of an opening 11 in the chassis 7 to the stage space. This exhaust amount control is always done during driving of the movable element 5 so as to optimize the amounts of exhaust. Alternatively, as a simple control method, exhaust at each end may be simply switched on/off, that is, control may be done so that exhaust at the end exhaust outlet closer to the movable element 5 is executed, while exhaust at the end exhaust outlet farther to the movable element 5 is disabled.

Figure 3A:
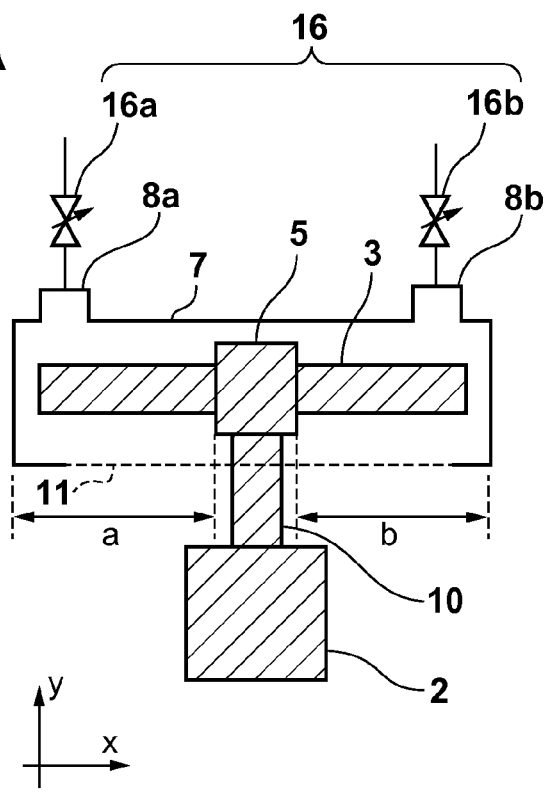
FIGS. 3A and 3B are views showing flow control of end exhaust outlets according to the second embodiment.
Figure 3B:
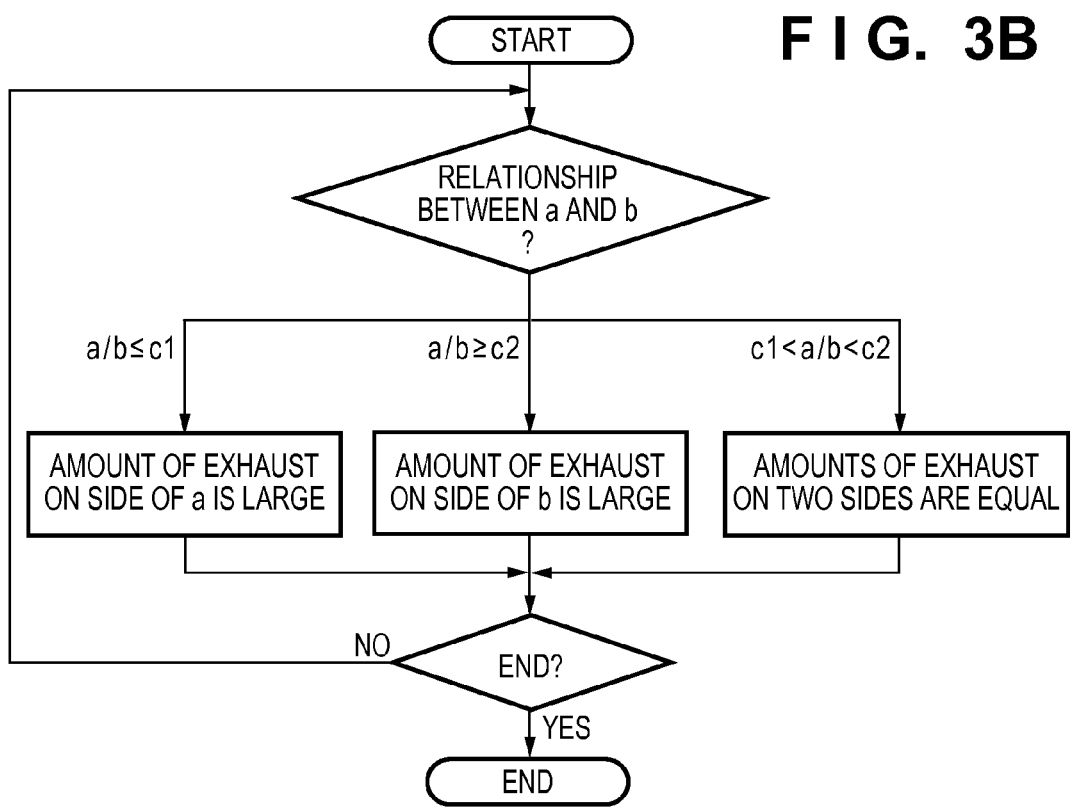

FIG. 3B is a flowchart illustrating an example of exhaust amount control by the controller C. First, the controller C calculates the distances a and b from the movable element 5 to the two ends of the chassis 7 based on the position information of the stage 2. The position information of the stage 2 is measured by an interferometer 14, as described earlier. The controller C then calculates a/b, and defines the calculated value as c, thereby performing three patterns of exhaust amount control in accordance with the magnitude of the value c.

Figure 4A:
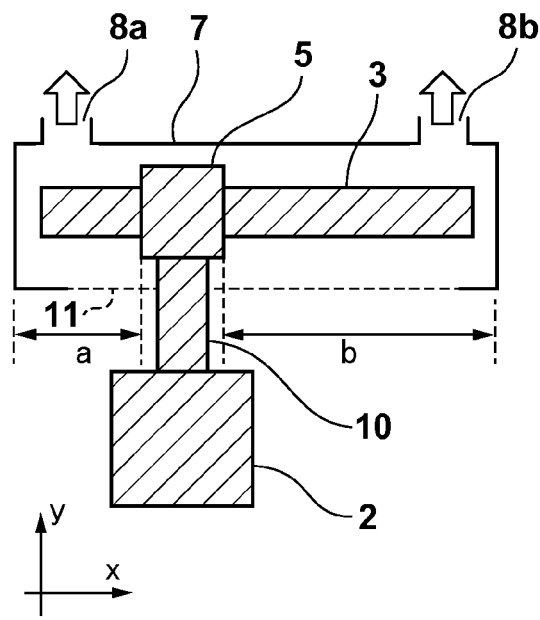
FIGS. 4A to 4C are views showing flow control of the end exhaust outlets according to the second embodiment.
Figure 4B:
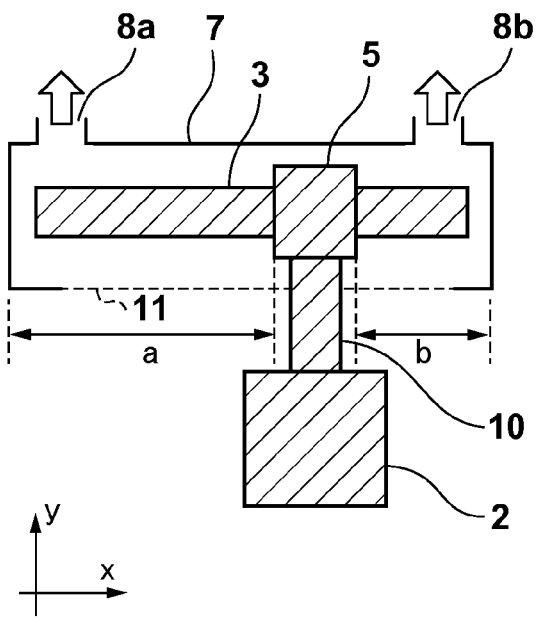
Figure 4C:
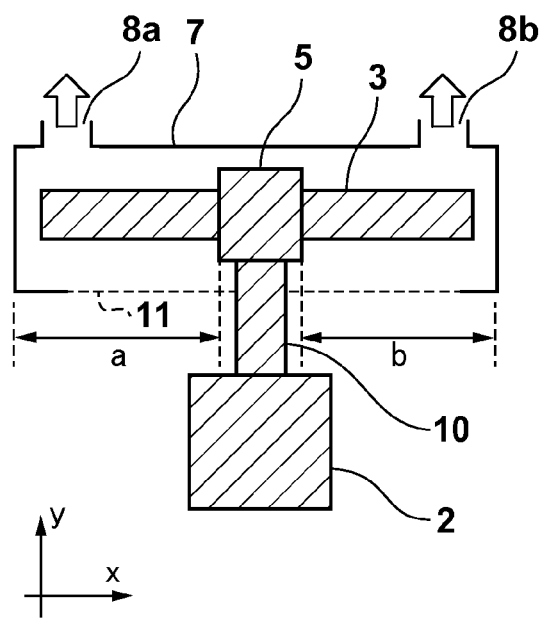

FIGS. 4A to 4C illustrate practical examples. As shown in FIG. 4A, if c (=a/b) is equal to or smaller than a predetermined value c1, flow control valves 16a and 16b are controlled so that the amount of exhaust from the end exhaust outlet 8a becomes larger than that of exhaust from the end exhaust outlet 8b. In this case, the end exhaust outlet 8b may be stopped. On the other hand, as shown in FIG. 4B, if c (=a/b) is equal to or larger than a predetermined value c2, the flow control valves 16a and 16b are controlled so that the amount of exhaust from the end exhaust outlet 8b becomes larger than that of exhaust from the end exhaust outlet 8a. In this case as well, the end exhaust outlet 8a may be stopped. FIG. 4C shows exhaust amount control when c1<c (=a/b)<c2, that is, the movable element 5 is positioned at the center of the driving range of the chassis 7. In this case, since sufficient distances are ensured between the movable element 5 and the two ends of the chassis 7, a heated atmosphere does not leak from the end of the opening 11. Hence, a feature of the second embodiment lies in that the gas in the chassis 7 is equally exhausted from both the end exhaust outlets 8a and 8b so as to maintain a given balance of the apparatus.

By sequentially repeating these control operations during driving of the movable element 5, heat leakage to the stage space when the movable element 5 is driven between the two ends of the chassis 7 can be suppressed with less exhaust. The predetermined values c1 and c2 are evaluation values calculated based on the apparatus size and driving conditions, and are set for each individual apparatus in accordance with the driving conditions. The end exhaust outlets 8a and 8b may be connected to the same exhaust pipe so that the total amount of exhaust (the sum of the flow rates of the respective exhaust outlets) becomes constant. This allows control without degrading the flow rate balance of the entire apparatus.

[Third Embodiment]

The third embodiment will be described with reference to FIGS. 5A to 5D. Note that two end exhaust outlets 8a and 8b are formed in one chassis 7 in the first and second embodiments, but not only end exhaust outlets 8a and 8b but also at least one central exhaust outlet 8c is formed in a chassis 7 in the third embodiment, as shown in FIGS. 5A to 5D. The central exhaust outlet 8c is arranged between the two end exhaust outlets 8a and 8b to forcibly exhaust the gas in the chassis 7 to the exterior, like the end exhaust outlets 8a and 8b. The flow rates of all these exhaust outlets can be controlled. These exhaust outlets may be connected to the same exhaust ducts and their total amount of exhaust may be maintained constant.

Figure 5A:
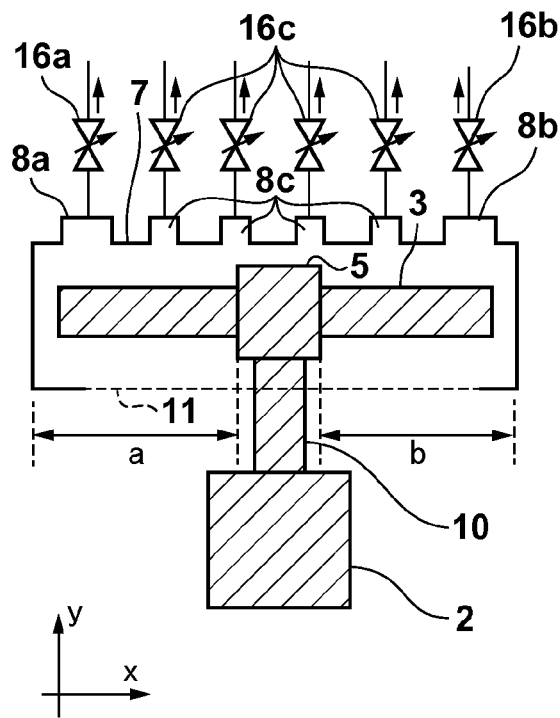
FIGS. 5A to 5D are views showing flow control of end exhaust outlets according to the third embodiment.
Figure 5B:
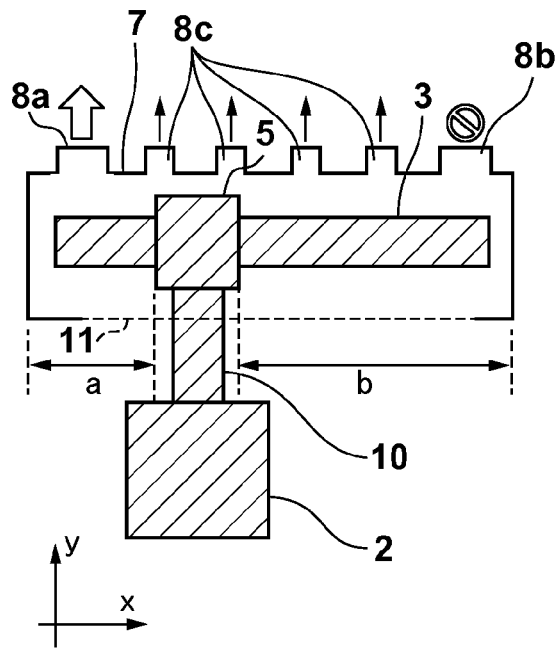
Figure 5C:
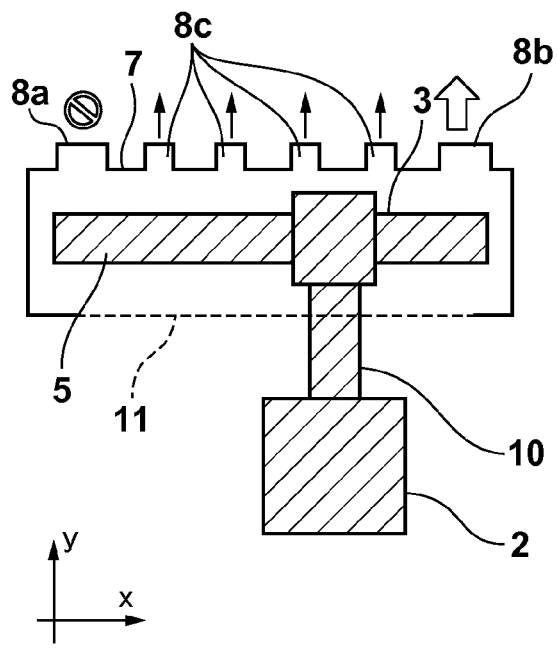
Figure 5D:
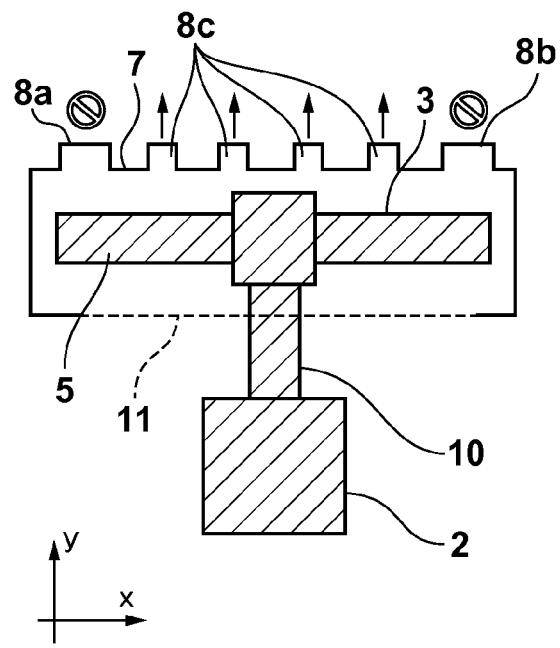

As in the second embodiment, a controller C calculates distances a and b from a movable element 5 to the two ends of the chassis 7 based on the position information of a stage 2. The controller C then calculates c=a/b to perform three patterns of exhaust amount control in accordance with the magnitude of the value c. As shown in FIG. 5B, if c (=b/a) is equal to or larger than a predetermined value c1, the amount of exhaust from the end exhaust outlet 8a is set larger than that of exhaust from the end exhaust outlet 8b. Exhaust from the end exhaust outlet 8b may be stopped. As shown in FIG. 5C, if c is equal to or smaller than a predetermined value c2, the controller C controls flow control valves 16a and 16b so that the amount of exhaust from the end exhaust outlet 8b becomes larger than that of exhaust from the end exhaust outlet 8a. In this case as well, the end exhaust outlet 8a may be stopped. As shown in FIG. 5D, if the movable element 5 is present at the center (c1<c<c2), the amount of exhaust from the end exhaust outlet 8a is set nearly equal to that of exhaust from the end exhaust outlet 8b, but both these amounts of exhaust may be zero. This is because when the movable element 5 is positioned at the center of the chassis 7, heat leakage to the stage space can be sufficiently suppressed by exhaust only from the central exhaust outlet 8c.

[Fourth Embodiment]

Figure 6:
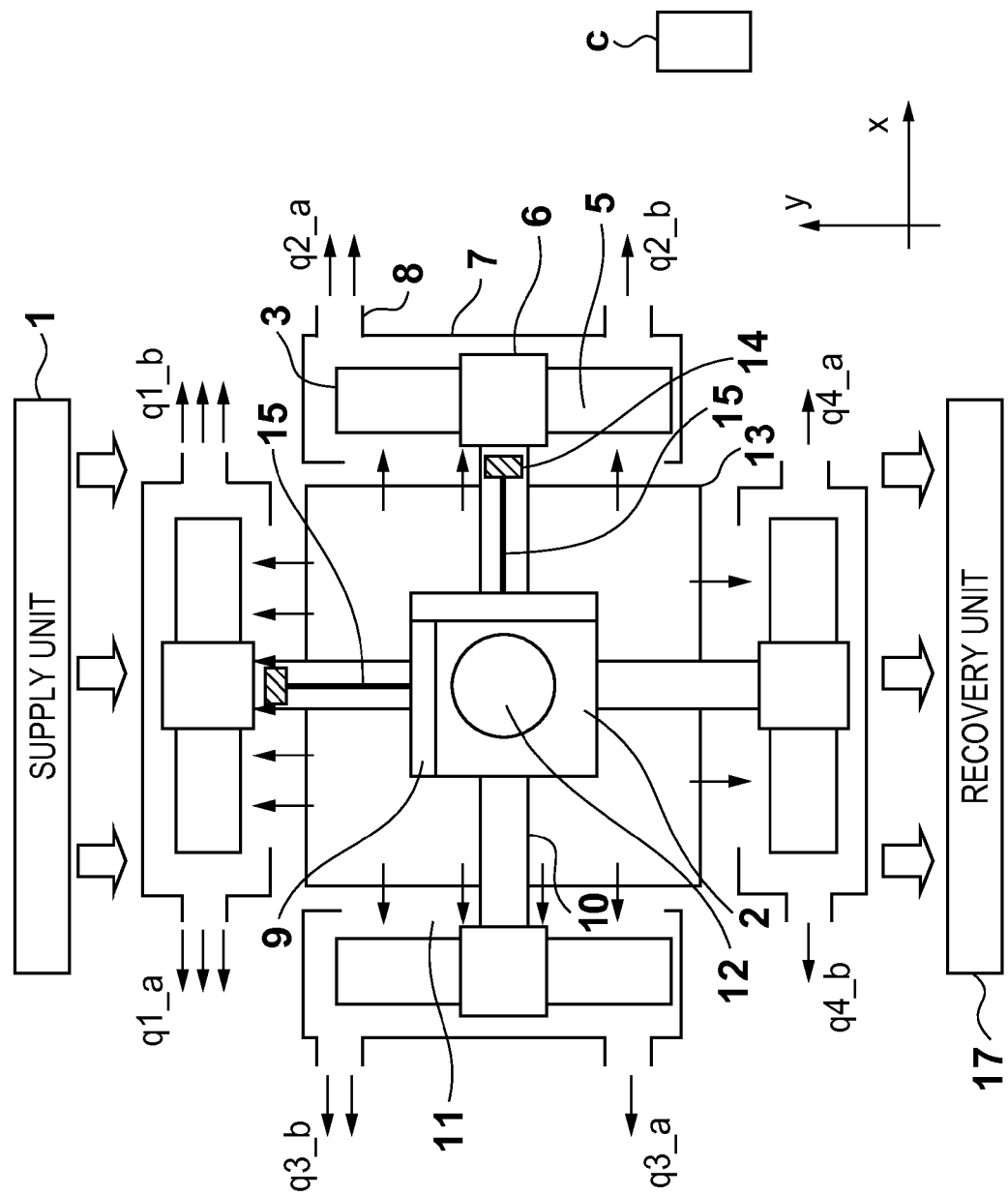
FIG. 6 is a view showing flow control of end exhaust outlets according to the fourth embodiment.

FIG. 6 is a schematic view showing the configuration of a positioning apparatus according to the fourth embodiment. The positioning apparatus is normally provided with two or four driving units so that they sandwich a stage 2. In FIG. 6, four driving units are arranged around the stage 2. A supply unit 1 which supplies a temperature-regulated gas to the entire stage space adopts a side flow type which almost horizontally supplies a gas onto a stage base 13, and is placed at one end of the stage base 13. A recovery unit 17 which recovers the gas is arranged on the opposite side of the stage 2 with respect to the supply unit 1, and the gas around the stage 2 flows in one flow direction from the supply unit 1 to the recovery unit 17. The position of the stage 2 is measured by two interferometers 14, and the stage 2 is arranged so that the measurement direction of each interferometer 14 becomes parallel to the driving direction of the stage 2.

At this time, by defining the amount of exhaust from each end exhaust outlet in accordance with the positional relationship with the optical path of the interferometer 14, the influence that heated air leaked from an opening 11 in a chassis 7 exerts on a light path 15 of the interferometer 14 can be reduced. Referring to FIG. 6, the amount of exhaust from an end exhaust outlet arranged upstream of the optical axis of the interferometer 14 in the direction in which the gas supplied from the supply unit 1 flows is set larger than that of exhaust from the end exhaust outlet arranged downstream of the optical axis of the interferometer 14 in the direction in which the gas supplied from the supply unit 1 flows. Upon this operation, heat leaked from the opening 11 in the chassis 7 positioned upstream of the light path (optical axis) 15 of the interferometer 14 is prevented from flowing into the light path 15 of the interferometer 14 along the flow of the supply unit 1. Amounts of exhaust $q1\_a$ to $q4\_b$ from the respective end exhaust outlets are controlled to satisfy:

$q1\_a$, $q1\_b > q2\_a$, $q3\_b > q2\_b$, $q3\_a > q4\_a$, $q4\_b$

In this inequality example, heat leakage from the end exhaust outlet closer to the upstream side exerts a more considerable influence on the entire stage space, so the amount of exhaust from the end exhaust outlet closer to the upstream side is set larger.

In the fourth embodiment, the amount of exhaust from each end exhaust outlet can be controlled upon driving of the stage 2, as described in the first to third embodiments, while maintaining the relationships among the magnitudes of the flow rates in the above-mentioned inequalities. Also, even if a plurality of heat sources are present in the stage apparatus, and local exhaust outlets are arranged in a number corresponding to the number of heat sources, the amount of exhaust from each local exhaust outlet can similarly be changed in accordance with the positions of the supply unit 1, the recovery unit 17, and the optical axis of the interferometer 14. In general, heat sources on the upstream side in the exposure apparatus include, for example, an illumination system in a reticle stage space and an alignment unit in a wafer stage space.

[Method of Manufacturing Device]

A method of manufacturing a device according to a preferred embodiment of the present invention is suitable for manufacturing a device such as a semiconductor device or an FPD. This method can include a step of exposing a substrate coated with a photosensitive agent to light using the above-mentioned exposure apparatus, and a step of developing the exposed substrate. This method can also include subsequent known steps (for example, oxidation, film formation, vapor deposition, doping, planarization, etching, resist removal, dicing, bonding, and packaging).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-177741 filed Aug. 15, 2011, which is hereby incorporated by reference herein in its entirety.

What is claimed is:

1. A positioning apparatus for a moving object, the apparatus comprising:
   a driving unit including a stator and a movable element connected to the moving object via a connecting member;
   a chassis which contains said movable element and said stator in a driving range of said movable element, and includes an opening which allows movement of the connecting member upon driving of said movable element, and an exhaust outlet which includes end exhaust outlets arranged at a first end and a second end, respectively, of the driving range;
   an exhaust unit which exhausts a gas in said chassis from said exhaust outlet; and
   a controller which controls said exhaust unit so that an amount of exhaust from said end exhaust outlet arranged at the first end becomes larger when said movable element is driven toward the first end on a side of the first end of the driving range than when said movable element is positioned at the center of the driving range.

2. A positioning apparatus for a moving object, the apparatus comprising:
   a driving unit including a movable element connected to the moving object via a connecting member, and a stator forming a chassis which contains said movable element in a driving range of said movable element, and includes an opening which allows movement of the connecting member upon driving of said movable element, and an exhaust outlet which includes end exhaust outlets arranged at a first end and a second end, respectively, of the driving range;
   an exhaust unit which exhausts a gas in said chassis from said exhaust outlet; and
   a controller which controls said exhaust unit so that an amount of exhaust from said end exhaust outlet arranged at the first end becomes larger when said movable element is driven toward the first end on a side of the first end of the driving range than when said movable element is positioned at the center of the driving range.

3. The apparatus according to claim 1, wherein said controller controls said exhaust unit so that an amount of exhaust from said end exhaust outlet arranged at the second end becomes smaller when said movable element is driven toward the first end on the side of the first end of the driving range than when said movable element is positioned at the center of the driving range.

4. The apparatus according to claim 2, wherein said controller controls said exhaust unit so that an amount of exhaust from said end exhaust outlet arranged at the second end becomes smaller when said movable element is driven toward the first end on the side of the first end of the driving range than when said movable element is positioned at the center of the driving range.

5. The apparatus according to claim 1, wherein said exhaust outlet includes at least one central exhaust outlet arranged between the first end and the second end.

6. The apparatus according to claim 2, wherein said exhaust outlet includes at least one central exhaust outlet arranged between the first end and the second end.

7. An exposure apparatus which exposes a substrate to light, the apparatus comprising:
   a stage capable of moving upon holding the substrate, said stage being positioned by a positioning apparatus,
   wherein the positioning apparatus includes:
   a driving unit including a stator and a movable element connected to the moving object via a connecting member;
   a chassis which contains said movable element and said stator in a driving range of said movable element, and includes an opening which allows movement of the connecting member upon driving of said movable element, and an exhaust outlet which includes end exhaust outlets arranged at a first end and a second end, respectively, of the driving range;
   an exhaust unit which exhausts a gas in said chassis from said exhaust outlet; and
   a controller which controls said exhaust unit so that an amount of exhaust from said end exhaust outlet arranged at the first end becomes larger when said movable element is driven toward the first end on a side of the first end of the driving range than when said movable element is positioned at the center of the driving range.

8. An exposure apparatus which exposes a substrate to light, the apparatus comprising:
   a stage capable of moving upon holding the substrate, said stage being positioned by a positioning apparatus,
   wherein the positioning apparatus includes:
   a driving unit including a movable element connected to the moving object via a connecting member, and a stator forming a chassis which contains said movable element in a driving range of said movable element, and includes an opening which allows movement of the connecting member upon driving of said movable element, and an exhaust outlet which includes end exhaust outlets arranged at a first end and a second end, respectively, of the driving range;
   an exhaust unit which exhausts a gas in said chassis from said exhaust outlet; and
   a controller which controls said exhaust unit so that an amount of exhaust from said end exhaust outlet arranged at the first end becomes larger when said movable element is driven toward the first end on a side of the first end of the driving range than when said movable element is positioned at the center of the driving range.

9. An exposure apparatus which exposes a substrate to light, the apparatus comprising:
   a stage which holds the substrate;
   a driving unit which includes a stator and a movable element connected to said stage via a connecting member, and reciprocally drives said stage in a direction parallel to a surface of the substrate;

a chassis which contains said movable element and said stator in a driving range of said movable element, and includes an opening which allows movement of the connecting member upon driving of said movable element, and an exhaust outlet which includes end exhaust outlets arranged at two ends, respectively, of the driving range;

an exhaust unit which exhausts a gas in said chassis from said exhaust outlet; and a controller which controls said exhaust unit so that an amount of exhaust from said end exhaust outlet arranged at the end becomes larger when the driving direction of said movable element is reversed at the end than when said movable element is positioned at the center of the driving range.

10. An exposure apparatus which exposes a substrate to light, the apparatus comprising:

a stage which holds the substrate;

a driving unit including a movable element connected to the moving object via a connecting member, and a stator forming a chassis which contains said movable element in a driving range of said movable element, and includes an opening which allows movement of the connecting member upon driving of said movable element, and an exhaust outlet which includes end exhaust outlets arranged at two ends, respectively, of the driving range;

an exhaust unit which exhausts a gas in said chassis from said exhaust outlet; and a controller which controls said exhaust unit so that an amount of exhaust from said end exhaust outlet arranged at the end becomes larger when the driving direction of said movable element is reversed at the end than when said movable element is positioned at the center of the driving range.

11. An exposure apparatus which exposes a substrate to light, the apparatus comprising:

a stage which holds the substrate;

an interferometer which measures a position of said stage;

a supply unit which supplies a temperature-regulated gas to said stage;

an exhaust unit which exhausts from a plurality of exhaust outlets the gas supplied from said supply unit; and a controller which controls said exhaust unit so that an amount of exhaust from an exhaust outlet arranged upstream of an optical axis of said interferometer in a direction in which the gas flows becomes larger than an amount of exhaust from an exhaust outlet arranged downstream of the optical axis in the direction in which the gas flows, wherein said controller controls said exhaust unit so that an amount of exhaust from each exhaust outlet reduces as a distance of the each exhaust outlet from said supply unit in the direction in which the gas flows increases.

12. The apparatus according to claim 11, further comprising:

a plurality of chasses, each of which contains a stator and a movable element connected to said stage via a connecting member, and includes an opening which allows movement of the connecting member upon driving of said movable element, and an exhaust outlet which includes end exhaust outlets arranged at two ends, respectively, of a driving range of said movable element, wherein the plurality of exhaust outlets include end exhaust outlets corresponding to said plurality of chasses.

13. A method of manufacturing a device, the method comprising:

exposing a substrate using an exposure apparatus;

developing the exposed substrate; and processing the developed substrate to manufacture the device, wherein the exposure apparatus comprises a stage capable of moving upon holding the substrate, the stage being positioned by a positioning apparatus, and the positioning apparatus includes:

a driving unit including a stator and a movable element connected to the moving object via a connecting member;

a chassis which contains the movable element and the stator in a driving range of the movable element, and includes an opening which allows movement of the connecting member upon driving of the movable element, and an exhaust outlet which includes end exhaust outlets arranged at a first end and a second end, respectively, of the driving range;

an exhaust unit which exhausts a gas in the chassis from the exhaust outlet; and a controller which controls the exhaust unit so that an amount of exhaust from the end exhaust outlet arranged at the first end becomes larger when the movable element is driven toward the first end on a side of the first end of the driving range than when the movable element is positioned at the center of the driving range.

* * * * *